(12) United States Patent
Warnock et al.

(10) Patent No.: US 7,178,075 B2
(45) Date of Patent: Feb. 13, 2007

(54) HIGH-SPEED LEVEL SENSITIVE SCAN DESIGN TEST SCHEME WITH PIPELINED TEST CLOCKS

(75) Inventors: James D. Warnock, Somers, NY (US); William V. Huott, Holmes, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/908,007

(22) Filed: Apr. 25, 2005

(65) Prior Publication Data

US 2006/0242506 A1    Oct. 26, 2006

(51) Int. Cl.
*G01R 31/28* (2006.01)
(52) U.S. Cl. .......................... 714/731; 714/744
(58) Field of Classification Search ............... None
See application file for complete search history.

(56) References Cited

U.S. PATENT DOCUMENTS

| | | | |
|---|---|---|---|
| 4,893,072 A * | 1/1990 | Matsumoto | 714/731 |
| 6,058,496 A * | 5/2000 | Gillis et al. | 714/727 |
| 6,452,435 B1 * | 9/2002 | Skergan et al. | 327/293 |
| 6,539,491 B1 * | 3/2003 | Skergan et al. | 713/500 |
| 6,567,943 B1 * | 5/2003 | Barnhart et al. | 714/727 |
| 2002/0073380 A1 * | 6/2002 | Cooke et al. | 716/1 |
| 2002/0166098 A1 * | 11/2002 | Chang et al. | 716/1 |

* cited by examiner

*Primary Examiner*—Albert Decady
*Assistant Examiner*—John P. Trimmings
(74) *Attorney, Agent, or Firm*—H. Daniel Schnurmann

(57) ABSTRACT

This invention describes a method of synchronizing test clocks in an LSSD system to achieve near simultaneous arrival of the clock signals at the inputs of all LSSD registers. The method relies on pipelining the latches to distribute the test clocks, where all pipeline latches are synchronized by the system clock. This enhancement improves the frequency at which the test clocks switch and improve the testing throughput by reducing testing time, resulting in significant reductions in testing hardware and overall time required for system test, without compromising any of the benefits associated with conventional LSSD techniques. The method further enhances the distribution of the test clock signals to points throughout the entire chip, with a distribution network that is tailored according to a desired LBIST speed.

17 Claims, 6 Drawing Sheets

HIGH-SPEED LEVEL SENSITIVE SCAN DESIGN TEST SCHEME WITH PIPELINED TEST CLOCKS

BACKGROUND OF THE INVENTION

The present invention relates, generally, to the field of Design Automation, and more specifically, to the design of complex combinatorial and sequential logic circuits embodied in very large scale integration (VLSI) circuit devices.

Faults occurring anywhere in VLSI circuit devices can have their effect propagated through a number of feedback loops formed of storage or memory elements in the sequential logic before reaching a test-able output of the device. Level Sensitive Scan Design (LSSD) rules were devised to eliminate complications in testing caused by this propagation through the feedback loops. As described by E. B. Eichelberger and T. W. Williams in an article entitled "A Logic Design Structure for LSI Testability" on pages 462–468 of the Proceedings of the 14th Design Automation Conf. LSSD rules impose a clocked structure on the memory elements of logic circuits and require that these memory elements be interconnected to form a shift register scan path so that the memory elements are all accessible for use as both a test input or output point. Therefore, with the scan path, test input signals can be introduced and test results observed wherever one of the memory elements occurs in the logic circuit. Being able to enter the logic circuit at any memory element for introducing test signals or observing test results, allows the combinational and sequential logic to be treated as much simpler combinational logic for testing purposes, thus considerably simplifying test pattern generation and analysis.

Single or multiple scan paths can be provided under the LSSD rules. Practitioners of the art will readily recognize that control means can be provided for LSSD scan circuits to switch between single or multiple path modes of operation.

LSSD has now become the industry standard scan design methodology. It uses separate test clocks (vs. functional clocks) for scanning data in or out of latches for test and debugging purposes. This technique is used widely across the industry for many microprocessor designs, as well as in ASICs. A segment of a conventional LSSD register is illustrated in FIG. 1 for purposes of discussion. Referring to FIG. 1, the sample LSSD register segment is seen to be composed of master (100, 101) and slave (200, 201) latches, with two input ports to the master. In the scheme shown, when the system clock is activated, system data is clocked in and out of the master latches (100, 101). This is typical of normal "functional mode" or "system mode". However, with the system clock input in an inactive state, if Shift A clock is activated, then the scan_data_out from a previous slave latch in the register is clocked in and out of the master latches. Shift B clock is energized after Shift A clock becomes inactive, clocking the data in and out of the slave latches (200, 201). By successively activating Shift A clock and Shift B clock in this fashion, data can be moved along through the register, step by step, in an orderly manner. There are many types and forms of LSSD latches used in the industry. The exact configuration of the LSSD latch is not important to this discussion, but it is important to understand how the LSSD latches and registers are used in typical LSSD designs.

The principle of operation of an LSSD register is as follows. In a normal "functional mode", also referred to "system mode", data is clocked in and out of the latch, as described above, and is synchronized by a high speed clock (system clock) which is distributed to all the latches across the design. For test and debug purposes, it is desirable to stop the system clock and read out the data stored in the registers to ensure that the system is functioning in the correct manner. It is also desirable to load specific data values into the registers, so that when the system clock is restarted, known data values will be presented to the system logic receiving inputs from the registers. In an LSSD system, once the system clock has been deactivated either locally, by way of controls at the individual registers, or globally (switched off for the entire system), both of these capabilities can be exercised. The data in all the LSSD registers is read out by way of successive Shift A and Shift B clock pulses as described above. For instance, after stopping the system clock, a Shift B clock pulse shifts all the system data captured in the latches to the scan_data_out port. It is evident that Shift A must remain inactive while Shift B is activated; otherwise data will "race" down the chain in an uncontrollable fashion. Then, a Shift A pulse takes the data to the scan_data_out port and clocks the data into the next latch of the register (i.e., Shift B clock is inactive while Shift A is active). In this manner, data is shifted serially through the register by successive clock pulses. By monitoring the final scan_data_out port of the register, it is possible to observe the data originally captured in each latch, as each successive Shift B clock pulse clocks a new data value to the output of the register. Furthermore, it is equally possible to load new data values into the LSSD register in the same fashion, starting from the first scan_data_in input of the entire register. Applying the desired data value to the first scan_data_in input of the register, the first Shift A captures the first bit of the data applied to the first latch of the register and a subsequent Shift B clock shifts the data to the scan_data_out port of the first latch. Then, a second data value is provided to the scan_data_in input, and the second Shift A loads this second data value into the first latch while the previous data is now loaded into the second latch of the register. This process continues until the desired data has been written into all the latches in the register.

Following the above discussion, it can be seen that LSSD registers can be of any size, or multiple registers can be strung together in series, with the final scan_data_out of one register connected to the first scan_data_in port of the next. In this manner, in an LSSD system, all the latches across the entire design are made observable and configurable, so that all the logic can now be tested and observed. This is shown schematically in FIG. 2, illustrating a conventional LSSD design.

For an LSSD configuration, a single stuck-fault model is used to generate test patterns applied to the circuit, and output responses are collected after each test for comparison with the precalculated "good circuit" responses. It has been shown that such stuck-fault test generation is one of a class of difficult mathematical problems called NP-complete, where NP stands for non-deterministic polynomial time, and complete meaning that a solution for one problem in the class can be extended to all. In all NP-complete problems, the number of possible solutions grows dramatically as the size of the problem increases. Therefore, the implication is that test generation computer time increases exponentially with the size of the circuit. In view of the foregoing, it appears that the best stuck fault test algorithms are only computationally feasible for fairly small or fairly simple networks and fault-oriented approaches become prohibitively expensive with the increasing circuit density of VLSI chips and modules.

In view of the foregoing, it has been suggested that self-testing be employed in connection with LSSD to reduce the time required for generating test patterns and for performing the actual test. Self-testing involves the use of pseudo-random pattern generators and response compression structures that are built into logic circuit devices. Using such pattern generators and compression, these structures eliminate the computer time required to generate the tests while placing these testing elements on the device containing the logic. Thus, the application of vast numbers of test patterns to the circuits in a reasonable period of time becomes possible.

Referring back to FIG. 2, a test control unit or TCU (100) (Test Control Unit) is shown providing the signals and the functionality needed for LBIST (Logic Built-In Self Test) to test the logic throughout the chip. The TCU provides non-overlapping Shift A and Shift B clock pulses that are distributed to all the LSSD latches and registers (300 through 303) on the chip. In addition, the TCU provides serial data which is loaded into the registers for test purposes and receives the serial scan_out data from the string of registers. This process makes it possible to analyze the data for test purposes (i.e., to ensure that the data received matches expectations). The combinatorial logic (400) is therefore tested by initially loading all the LSSD registers with known values from the TCU, running some number of system clock cycles, reading out all the register data, and comparing it in some fashion to the expected data. FIG. 2 also illustrates a "bypass" mode. If there is a problem with the TCU, or if for some reason it is suspected that the TCU is not operating correctly, it may be desirable to provide independent Shift A and Shift B clock inputs from an off-chip source (i.e., through a primary input). This is accomplished by way of multiplexer (200) which allows the selection of the Shift A and Shift B clock source. The scan_out data can also be sent to a chip output, to be observed directly. Further, it may also be desirable to have a separate scan_in input from off-chip as well.

Practitioners of the art will readily recognize that actual LSSD systems are highly complex, and considerably more than the illustrative example shown in FIG. 2. A chip (multi-chip module, board, frame and the like) may contain hundreds of thousands of LSSD latches typically divided into multiple strings of registers. Generally, registers provide inputs to and receive inputs from any given block of combinatorial logic. However, the basic principles illustrated in FIG. 2 remain unchanged.

There are several issues and problems when designing LSSD systems. As described previously, Shift A and Shift B clock signals must be distributed to every LSSD latch and register across the entire chip. This is shown schematically in FIG. 3. It is apparent that the characteristics of Shift A and Shift B clocks, received at, e.g., register 307, are quite different from those at register 300, since cross-chip wires typically have large delays and may require insertion of many buffering stages (not shown). These buffering stages must be added to maintain acceptable Shift A and Shift B clock waveforms at each latch. Typically, buffers are added to every major branching point in each distribution tree to isolate the capacitance of all the branches from the resistance of the long "trunk". In addition, even straight-line wires are broken into discrete segments (perhaps 1 mm in length) to avoid excessive RC delay in the wire, poor signal slew, extreme sensitivity to coupled noise, and other disturbances on the chip. Given that actual chips have hundreds of thousands of LSSD latches, one may expect to encounter extremely complicated routing and buffering trees for the Shift A and Shift B clock signals. Furthermore, one must ensure that during scan testing, the Shift A and Shift B clocks never overlap anywhere (i.e., are never both on at the same time). Furthermore, on every Shift A and Shift B clock cycle, each clock individually must remain high long enough to cause new data to be written into master or slave sections of all the latches.

Now, as microprocessor (and ASIC chip) frequencies continue to increase, technology scaling provides ever higher circuit densities and chips continue to increase in size, it is becoming increasingly difficult to distribute the Shift A and Shift B clocks at very high frequencies, given the design constraints described previously. There are a number of fundamental reasons why this is so.

First, in order to continue making improvements to the operating frequency of these chips, a common technique is to divide the logic up into finer and finer "slices", each slice preferably separated from the next by a latch element. In this way, the overall logic depth between any two latches decreases, reducing the time required for propagation from the latch through the logic, and then into the capturing latch. This reduces the propagation delay, and translates it into a higher operating frequency. However, it is apparent that this technique leads to a proliferation in the number of latches needed to design the chip. Since the test clocks have to be distributed to each latch, increasing the number and density of latches on the chip in the manner described above leads to an increase in the complexity of the test clock distribution, causing the overall propagation time (and associated timing uncertainties) to increase as well. It is evident that the larger uncertainties associated with these larger delays implies that the Shift A and Shift B clocks have to be spaced further apart to ensure non-overlap, and clock pulses must be made wider at the source to ensure that they remain sufficiently wide at all the sinks (i.e., LSSD latches). These requirements effectively limit the frequency of the test clocks. In addition, as the chip frequency increase when segmenting the logic into ever finer slices, it is apparent that this segmentation will not help to speed up the distribution of the test clocks (it actually hinders it, as described above, since the number of latches increases). Thus, the imbalance between the microprocessor frequency and test clock frequency tends to increase when this technique is utilized.

The second reason is related to fundament VLSI scaling principles. As technology scaling continues, both wire widths and heights are reduced according to the technology scale factor, implying that the wire cross-sectional area decreases proportionately to the square of the lithography length scale. This means that the resistance per unit length of wire increases as the inverse of the square of the lithographic dimension. The capacitance per unit length tends to stay about constant since the decreasing space between adjacent wires is countered by the decreasing profile of the wires. Therefore, even if the chip size remains constant as the lithographic dimension decreases, the RC delay through the wires increases rapidly, necessitating the insertion of larger numbers of buffering elements to maintain acceptable clock waveforms and slews. It is observed that the propagation delay through the test clock network tends to be magnified as a result of these scaling principles, and the larger uncertainties associated with these larger delays again limits the frequency of the test clocks.

Finally, technology scaling has led to an ever greater density in the number of circuits (including latches) on the chip. Thus, in addition to the two factors described above, the increase in the number and density of latches on the chip greatly increases the difficulty of the test clock distribution problem. Again, more buffering stages need to be added as the distribution tree is made ever more complex. This extra delay leads to an additional uncertainty and disparity in the clock arrival times at the latches, which again will have a negative impact on the maximum test clock frequency.

The above implies that relatively large intervals must separate the Shift A from the Shift B clock cycles, and each test clock must remain active for a longer period of time to ensure propagation of a sufficiently wide pulse. Typically, the test clock frequency is specified as some fraction of the functional clock frequency. A typical ratio of functional to test clock frequencies is of the order of 16:1. Therefore, if a chip were designed to run at 4.8 GHz, test clocks will typically run at 300 MHz.

Accordingly, the conventional scan clock test methodology of this type is not ideal in various ways. First, LBIST time is relatively long because the rate at which data is scanned through all the LSSD registers is limited by the slow test clocks. Second, since scanning occurs at a low frequency, power is relatively low during scanning, but the chip will see large power transients when the functional clocks are fired during LBIST testing. Third, the overall timing relationships between the Shift A and Shift B clock distributions and the functional clock, and the test control signal distribution are unknown and vary across the chip. Therefore, a gap needs to be provided between an operation in test mode (i.e., with Shift A and Shift B clock toggling), and an operation in functional mode with functional clocks (e.g., for LBIST testing). This gap further exacerbates power transients during test, and limits the testability or test strategy in certain ways. Finally, since Shift A and Shift B clocks run at different frequencies from the functional clocks, a separate timing verification process is usually needed, and possibly even a separate set of timing models needs to be generated, all of which requires considerable additional work for the design team.

A known solution to the problem described above is the so-called GSD (general scan design) methodology. This methodology, as commonly implemented, uses the functional clock for all the clocking (both for scanning and functional operations). The mode of operation is set by control signals that select which data to write into the latch (either functional, system data, or test data). This technique solves the problems mentioned above, but introduces new issues of its own. First, there is no capability for driving separate test clocks into the chip from external inputs (since there is no separate test clock any longer). Second, it implies that a separate Mux (multiplexer) needs to be inserted in front of each scannable latch to allow choosing between scan data vs. functional data. This increases the delay and/or the power consumption, and possibly the area. The Mux can be merged into a latch as a separate data port, in which case, a scan clock needs to be generated locally from the functional clock (with a select control to choose which clock to fire). In such instance, the scan data ports on the latches must be sufficiently large to guarantee writing the scan data with a single test clock pulse, even for a worst case duty cycle (i.e., minimum clock pulse width). If the scan port on the latch is too slow, it limits the frequency of the AC test (since the test clock is generated locally from the functional clock, it always runs at the same frequency as the functional system clock). In addition, for a typical master-slave flip-flop, three clocks need to be generated from the system clock (c1 and c2 for functional purposes, and a "scan c1" for clocking the scan port). This third clock increases the loading on the mesh by approximately 50% when compared to the LSSD architecture, all other constraints remaining the same (LSSD requires only the two functional clocks to be generated from the system clock), and also increase the power consumed, depending on the configuration used to select between c1 and the scan c1 clocks. Further, the GSD arrangement generally requires two at-speed AC test control signals to be distributed across the chip, compared to only one, for most LSSD applications. Furthermore, if any of the control signals is slower than expected or slower than the particular logic or does not meet the full frequency timing requirement anywhere in its distribution network, the frequency at which the chip is to be tested will be limited.

OBJECTS AND SUMMARY OF THE INVENTION

Accordingly, it is an object of the invention to provide a method for allowing higher test clock frequencies by combining LSSD testing techniques with a clock tree latency configuration.

It is another object to provide a method for achieving higher functional performance based on an improved test clock frequency.

It is still another object to improve testing throughput by reducing testing time, resulting in significant savings in expensive testing hardware.

It is a further object to provide an apparatus that enhances a conventional LSSD configuration by way of small pipeline latches that are clocked off the system clock.

It is a yet a further object to provide an apparatus that enhances the distribution of the Shift A and Shift B clock signals to points throughout the entire chip, with a distribution network that is tailored according to a desired LBIST speed.

The invention provides a method for improving the frequency of test clocks in a Level Sensitive Scan Design (LSSD) system wherein non-overlapping Shift A and Shift B test clocks are synchronized to rise and fall simultaneously at inputs of all LSSD registers, the method includes the steps of: a) determining the number of pipeline stages needed to reach the farthest corner of the system to establish the depth of the pipeline; b) grouping the LSSD registers into regions defined by the number of pipeline stages needed to ensure high speed operation; c) balancing the pipeline depth to achieve a simultaneous rise or fall of a signal at the inputs of the LSSD registers; and d) ensuring that all test clocks are distributed at high speed, and verifying that all the pipeline latches are placed in a predetermined proximity to the LSSD registers to enable high speed synchronous propagation of the Shift A and Shift B test clocks.

The pipeline latches mentioned above are clocked from the system clock, and by following the series of steps described, the Shift A and Shift B test clocks are guaranteed to be synchronized with the system clock across the entire system. Further, the approach of using latches to pipeline and synchronize the test clocks eliminates the uncertainties usually associated with the distribution of such clocks to every LSSD register in a complicated VLSI design. In this way, the Shift A and Shift B clocks can be reliably designed to run at much higher frequencies than would otherwise be practical using conventional techniques.

BRIEF DESCRIPTION OF THE DRAWINGS

These and other objects, aspects and advantages of the invention will be better understood from the detailed preferred embodiment of the invention when taken in conjunction with the accompanying drawings.

DETAILED DESCRIPTION

The inventive method is designed to enhance a standard LSSD configuration by way of small pipeline latches (clocked off the system, functional clock) to distribute the Shift A and Shift B clock signals to various points throughout a VLSI design, with a distribution network that is tailored according to the desired Shift A and Shift B clock frequencies. Using the pipeline latches for distribution of the Shift A and Shift B clocks allows the clock edges to be synchronized across the entire system, but still allows control of the Shift A and Shift B clock periods (with a granularity now measured in units of system clock cycles) in an arbitrary fashion. Using this type of architecture, LBIST is preferably designed to run at frequencies of up to one-half the system clock frequency (compared to one-sixteenth for a more typical LSSD scheme). Also, since the main portion of the Shift A and Shift B clock distributions are through pipeline latches, the arrival times of the Shift A and Shift B clocks at the latches are relatively predictable, and no large timing gap is required between the end of the scanning operation and the start of functional mode operation. Both of these features help smooth out transients described above, as encountered in LBIST testing.

A detailed description of the preferred embodiment of the present invention will now be described.

Figure 1:
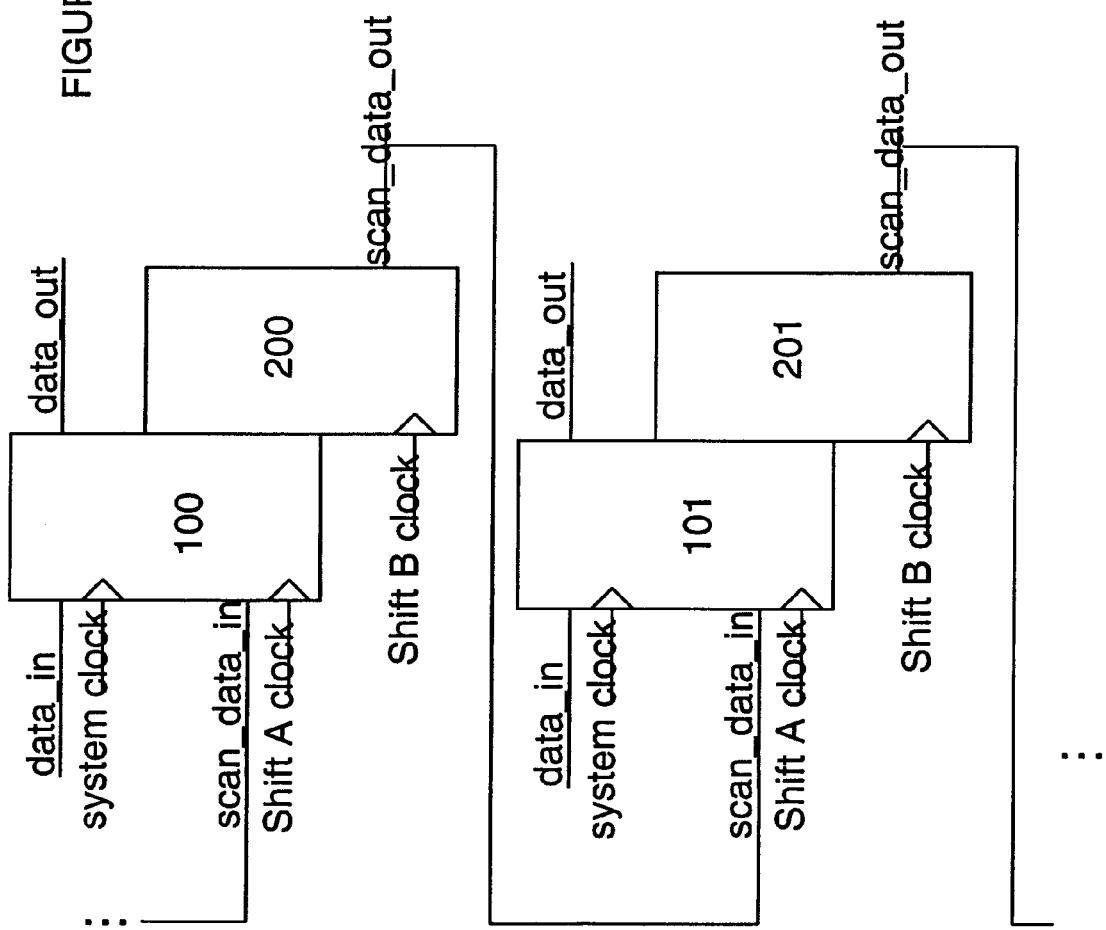
FIG. 1 is a section of a prior art LSSD register.
Figure 2:
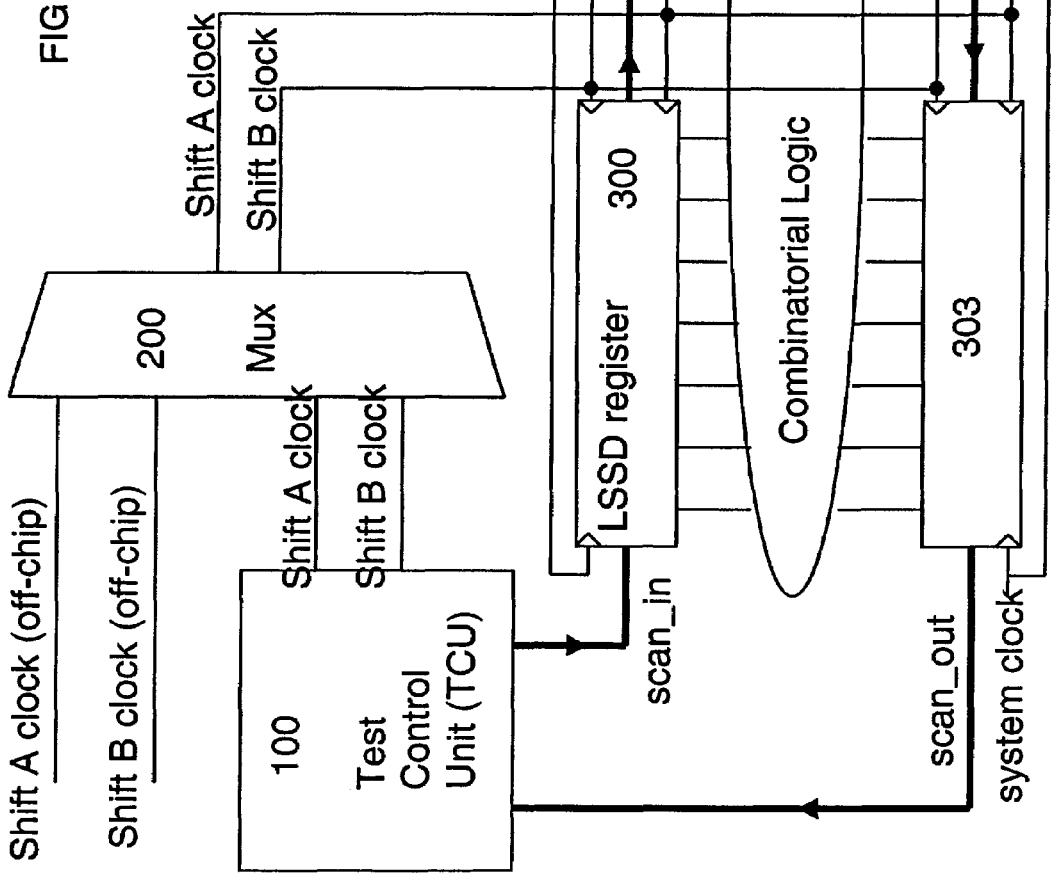
FIG. 2 is a schematic illustrating a conventional LSSD design.
Figure 3:
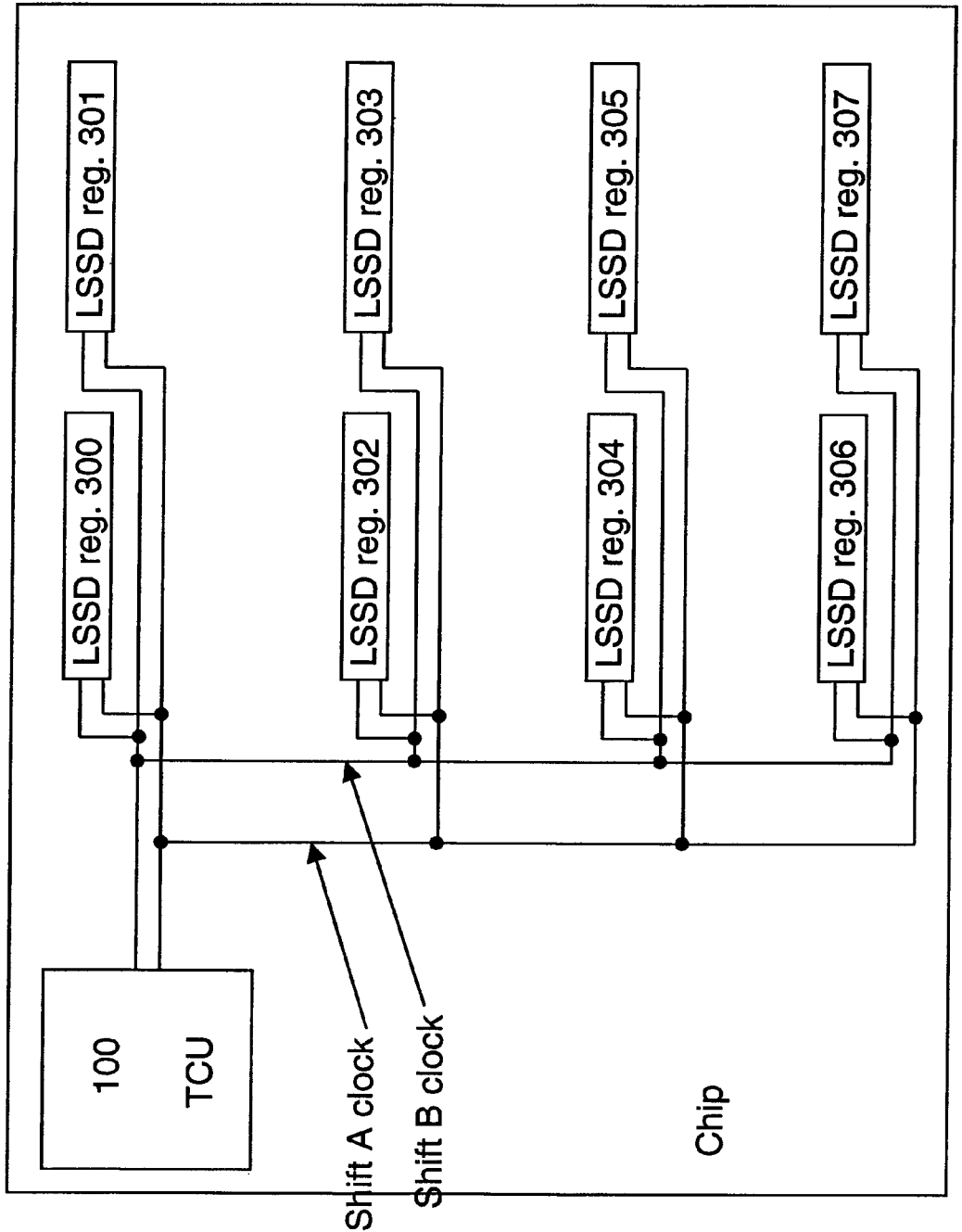
FIG. 3 is a schematic that illustrates a prior art distribution of Shift A and Shift B clocks across a chip.

Given the type of Shift A and Shift B clock distribution configuration described in FIG. 3 (except that it is thousands of times more complex, for any actual design), it is evident that it would be very costly and impractical to distribute these signals in the same manner used for the system functional clock. Generally, the Shift A and Shift B clocks are buffered as necessary, with many levels of buffering, long wire distribution, and significant delays required for reaching all the points of a large microprocessor chip. As a result, some latches receive the Shift A and Shift B clock signals very early, while others receive those clock signals much later. This type of scheme requires that the Shift A and Shift B clocks run at relatively low frequencies (compared to chip functional frequency) because of the large uncertainties associated with timing of these large complicated networks, and the difficulties associated with propagating a single set of signals to hundreds of thousands of latches on a chip. It is readily seen that the large and complicated networks needed to distribute Shift A and Shift B clocks result in significant propagation delays and large latencies for these clocks, directly limiting the frequency the Shift A and B clocks operate at.

Figure 4:
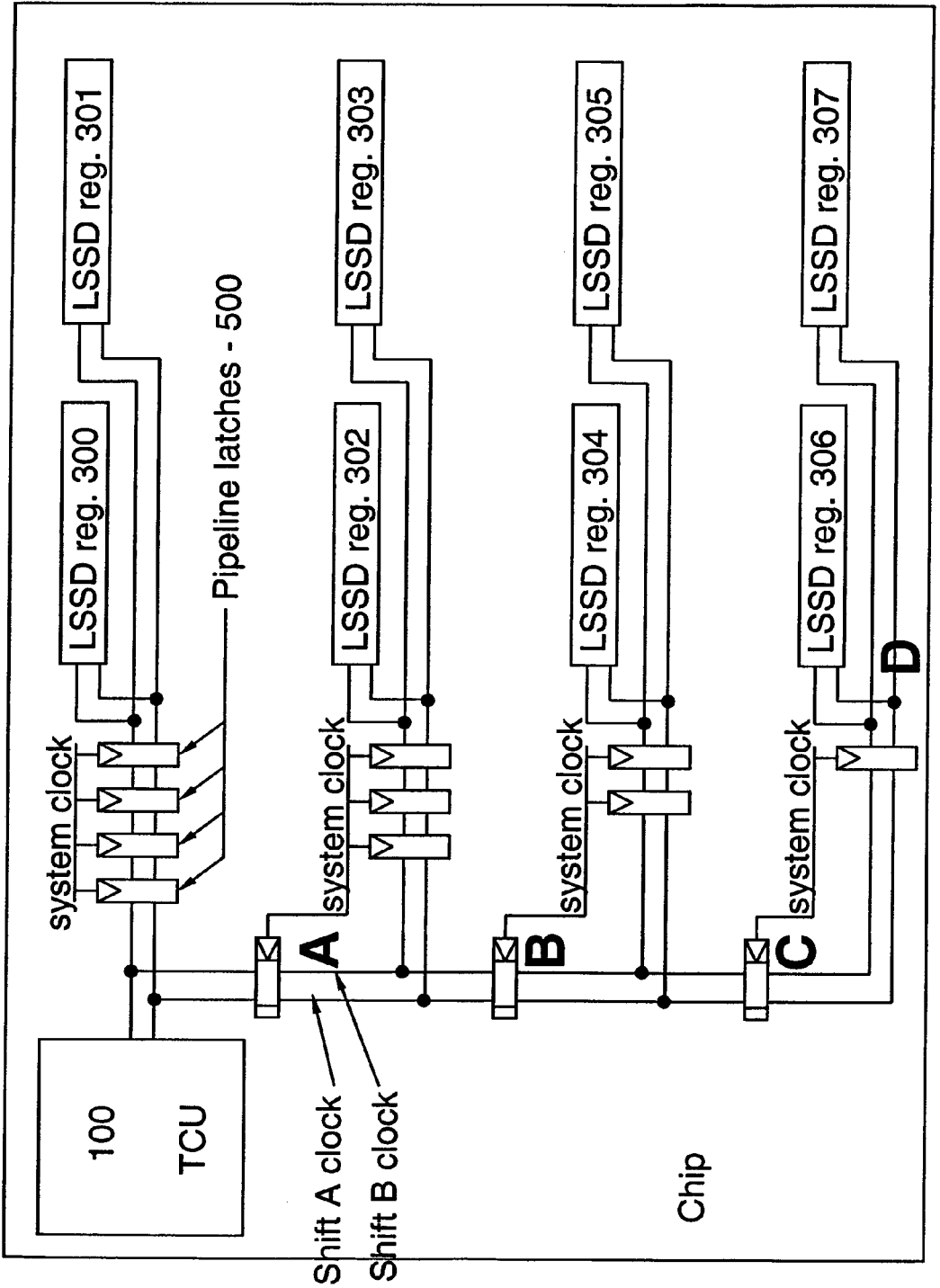
FIG. 4 is a schematic showing a Shift A and Shift B clock distribution with the addition of pipeline latches, in accordance with the present invention.

FIG. 4 illustrates how the Shift A and Shift B clock distribution shown in FIG. 3 improves using the invention summarized above. In this case, the Shift A and Shift B clock signals are synchronized everywhere across the entire chip by inserting special pipeline latches (500), triggered off the global system clock. These pipeline latches act as synchronizing stages for the propagation of the Shift A and Shift B clocks, keeping these clocks synchronized with the system clock everywhere across the entire chip. At the start of every system clock cycle, the value of the Shift A (or B) clock at the input to any given pipeline latch is sampled, and the value is passed to the output of that pipeline latch, after a certain amount of propagation delay. The sampling occurs only at the very beginning of the system clock cycle, so that if any Shift A (or B) clock transition arrives at a pipeline latch later during the cycle, the transition is not propagated forward until the next cycle begins. In this way, Shift A (or B) clock transitions are synchronized across the entire chip, even for arbitrarily complicated networks. Still referring to FIG. 4, it is observed that when the TCU changes the value of either Shift A or Shift B clock, four system clock cycles are required to propagate the new value to LSSD registers 300 and 301, (since there are four pipeline latches between the TCU and the inputs to LSSD registers 300 and 301). Similarly, four pipeline latches are shown between the TCU and any other LSSD register; therefore, Shift A and Shift B transitions launched by TCU are guaranteed to arrive at every LSSD register on the same system clock cycle and synchronized across the entire chip. By contrast, in the prior art design (FIG. 3), any change in Shift A or Shift B clocks propagate very quickly to registers 300 and 301 since they are very close to the TCU. Propagation delay to registers 306 and 307, however, take much longer, being far away from the TCU. In prior art designs, attempts have been made to add buffers and other delay elements to balance Shift clock delays for the nearby registers. It is, however, impractical and difficult to balance and match all the delays of all the added elements with the extensive wire RC delays and other delays of the rest of the distribution tree.

The above discussion assumes in the context of the invention as illustrated in FIG. 4, that whenever a new Shift A or Shift B clock transition is launched out of a pipeline latch, there is enough time for the transition to propagate to the input(s) of the receiving pipeline latch(es) before the start of the next system clock cycle. If the next pipeline latch is positioned too far away, the new Shift clock value will not make it in time to the input of the latch to be sampled and passed through to the output at the start of the next cycle. In this case, the new value will have to wait until the start of a later system clock cycle, and will thus be out of synch (one or more cycles later) with the propagation of the rest of the Shift A and Shift B clocks across the chip. Therefore, a practical implementation of the invention requires first determining how many pipeline latch stages are necessary to reach the LSSD registers furthest away from the TCU (e.g., 4 in the simple example shown in FIG. 4). This sets the depth of the pipeline.

After setting the pipeline depth as described above, LSSD registers are grouped in regions depending on the hierarchy and natural partitioning of the design and their proximity of the LSSD registers to the TCU. For each region, additional pipeline latches are added before distributing the test clock signals to the LSSD latches in that region in order to balance the overall pipeline depth. In this manner, shift clock signals driving LSSD registers in the regions nearer to the TCU will have "extra" pipeline latches to balance the Shift A and Shift B clock pipelines to these regions.

Referring to FIG. 4, it is apparent that three additional pipeline latches have been added to balance the pipeline to registers 300 and 301 in the region close to the TCU; two additional pipeline latches are added to balance the pipeline to registers 302 and 303 in a more distant region; and one additional pipeline latch is added to balance the pipeline to registers 304 and 305. In this manner, one is assured that all the LSSD registers receive the Shift A and Shift B clock signals concurrently across the entire chip.

Since the system clock has already been distributed across the entire chip with minimal skew, the addition of pipeline latches places little extra burden on the design of the system clock distribution. Also, as long as the total delay (wire and buffers) between any two pipeline latches is less than the system clock cycle, all the Shift A and Shift B clock signals across the entire chip will remain completely synchronized, not only with each other, but also with respect to the system clock.

With the arrangement shown in FIG. 4 describing one embodiment of the invention, it is evident that LSSD registers 300 and 301 will receive Shift A and Shift B clock signals exactly four system clock cycles after they were originally launched by the TCU, since each pipeline latch will delay the rising or falling Shift A or Shift B clock edge until the start of the next system clock cycle. Similarly, registers 306 and 307 will receive Shift A and Shift B clock edges at the same time as registers 300 and 301 (and similarly, for registers 302, 303, and registers 304, 305).

Although it is unusual to make reference to pipelining clock signals (usually, clock signals synchronize other data; as such, they are not used to form pipelines by themselves). The inventive method takes advantage of the fact that the test clocks (Shift A and Shift B clocks) are logically separate from the system clock, and so the system clock can be used to synchronize the test clocks. The depth of the pipeline is set by the number of pipeline stages needed to reach the farthest corner of the chip (e.g., in FIG. 4, the pipeline depth is four, and may be increased or decreased as necessary). The pipeline is only required to be structured such that the number of pipeline latches traversed to reach any arbitrary local distribution network remains always constant. The Shift A and Shift B clock signals are timed between pipeline latches in the normal fashion, i.e., in the same manner logic is timed over the rest of the chip to ensure that the chip operates at the proper frequency, with the cycle time set by the system functional clock frequency. This timing analysis is preferably carried out simultaneously with the timing analysis of the rest of the logic of the chip. Such timing analysis generally requires an analysis of the wire distributions, buffering, delay and loading of all the pipeline latches in order to guarantee that all the Shift A and Shift B test clock signals are received at the next pipeline latch or at the input of an LSSD register within the allowable system clock cycle time. Placement of the pipeline latches requires some iterative adjustments necessary to guarantee the capability of high-speed operation. It may also be necessary to make other iterative adjustments to the pipeline latches (including, but not limited to, changes to the pipeline depth, if the initial assessment was incorrect, or changing the grouping and/or assignment of the LSSD registers to specific regions, or adding additional pipeline latches in parallel to improve the overall speed of the test clock distribution). Of course, the procedure of defining, building, and tuning the network of pipeline latches may be advantageously implemented in an automatic or semi-automatic fashion by use of programs tailored for such a purpose, or by the use of other design automation tools.

Figure 5:
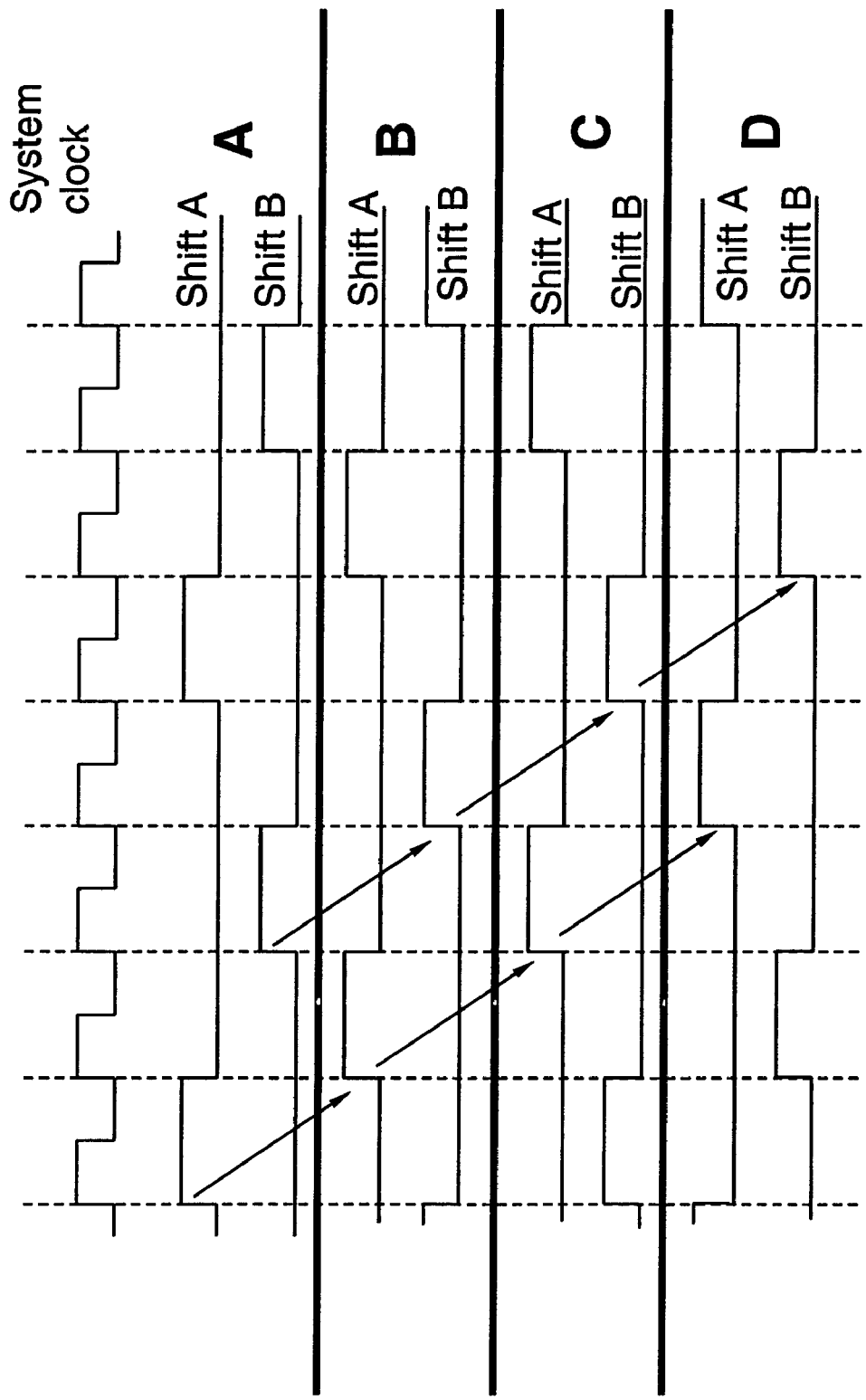
FIG. 5 illustrates some Shift A and Shift B clock waveforms at various points in the pipeline, according to the present invention.

Referring to the points labeled A, B, C, D in FIG. 4, the waveforms for Shift A and Shift B clock are shown at various points in the pipeline in FIG. 5.

The waveforms shown in FIG. 5 illustrate an LSSD operation at a frequency that is reduced by a ratio of 4:1 compared to the system clock frequency. It is also possible to run the Shift A and Shift B clocks even faster, e.g., at a 2:1 rate, although, avoiding overlap of the clocks becomes somewhat more difficult. Local buffers for Shift A and Shift B clock are preferably skewed to delay the rising edge of the clock waveform to avoid overlap. Also, if it is found that the power consumption is too high with a 4:1 (or 2:1) scan rate, dead cycles are inserted as necessary to change the effective operating frequency in a smooth fashion, to match whatever power consumption level is desirable.

It is important to note that pipelining the Shift A and Shift B clock signals differs from pipelining the remaining test control signals used in the LSSD or GSD scan configurations. If the timing on the other test control signals is slower than expected, the slow paths will cause LBIST failures, and limit the frequency at which the part is tested. It is not possible to recover from this situation without adjusting the failing paths in the design and building new hardware. However, if Shift A and Shift B clocks are slower than expected, it is still possible to modify the Shift A and Shift B clock frequency without impacting the maximum LBIST test frequency. The system clock frequency is kept at the desired setting, and more idle cycles are inserted between the Shift A and Shift B clock pulses to avoid overlap in the presence of timing errors, where the edge of Shift A or Shift B clocks are delayed by an additional cycle due to a timing error. Also, if necessary, Shift A and Shift B clocks are kept active for more cycles to ensure that a clock pulse reaches every LSSD latch. The rate at which data is scanned in and out of the LSSD registers will be affected, but not the speed at which the functional clock needs to run. Therefore, it is possible to test the part even when the pipelining of these clock signals does not to operate in a perfectly ideal way. Or course, it is preferable to repair this problem in subsequent iterations of the hardware in order to speed the test time, and gain the advantages previously described.

Even though the Shift A and Shift B clocks are distributed through pipeline latches, it is possible to drive the Shift A and Shift B clock networks directly from an off-chip source, if the pipeline latches are equipped with a "flush" control. This flush control serves two purposes: it deactivates switching the gates internal to the pipeline latches when running the chip in a normal mode (i.e., when the chip is not being tested), and it further provides direct control of Shift A and Shift B clocks without interference from the pipeline latches.

Figure 6:
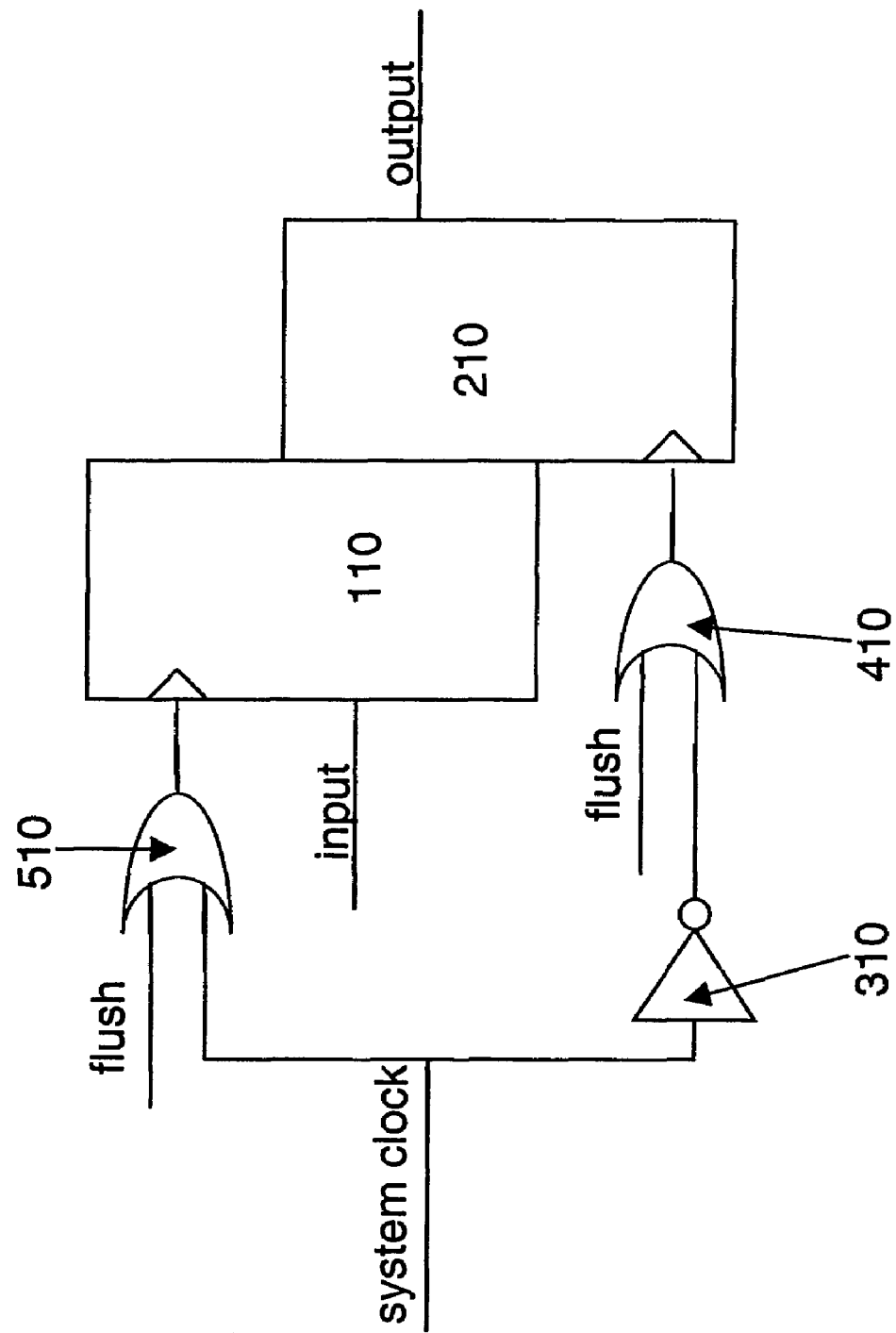
FIG. 6 shows a simple example of how a pipeline latch of the present invention incorporates a flush control.

FIG. 6 provides an example of how a pipeline latch incorporates such a flush control. Shown therein is a latch that pipelines either Shift A or Shift B clock. When the flush is asserted, the pipeline latches become transparent, independent of the state of the system clock. Shift A and Shift B clock are thus controlled directly from an off-chip source. In this particular implementation, when the signal flush is asserted, the clock input to the master section of the pipeline latch (110) is forced to high, allowing the input data to be loaded into the master latch, and propagated to its output. OR gate (510) ensures that the clock input is at high when the flush is at high, independent of the state of the system clock input. Similarly, the other OR gate (410) also forces the clock to the slave latch (210) to be in an active state when the flush is asserted. In this manner, the output of the master latch is loaded into the slave latch and is propagated to the pipeline latch output. Therefore, when a flush is asserted, data is immediately propagated from the pipeline latch input to its output, independent of the state of the system clock, and all the strings of pipeline latches propagate data independently from the system clock. In this manner, the pipelining action of the latches is overridden and Shift A and Shift B clocks are directly controlled from an off-chip source, with no interference from the system clock. Similarly, when the flush is deactivated, all the pipeline latches operate normally, propagating data to and through the master when the system clock is at high, and propagate data to and through the slave when the system clock is at low. Finally, when in normal mode, the flush control inhibits any local clock switching in the pipeline latches in order to save power. Other configurations of pipeline latches are possible, with or without flush controls, as well as other clock controls. The usefulness of the invention is not dependent on a particular configuration of the pipeline latch.

While the present invention has been particularly described, in conjunction with specific embodiments, it is evident that other alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for maximizing the frequency of test clocks in a Level Sensitive Scan Design (LSSD) system wherein non-overlapping Shift A and Shift B test clocks are synchronized to rise and fall simultaneously at inputs of all LSSD registers, the method comprising the steps of:
   determining the number of pipeline stages needed to reach the farthest corner of said LSSD system to establish the depth of the pipeline;
   grouping said LSSD registers into regions defined by the number of pipeline stages needed to ensure high speed operation;
   balancing the pipeline depth to achieve simultaneous rise or fall of a signal at the inputs of said LSSD registers; and
   ensuring that all Shift A and Shift B test clocks are distributed at high speed, and verifying that pipeline latches are placed in proximity of said LSSD registers to enable a high speed synchronous propagation of the Shift A and Shift B test clocks.

2. The method of claim 1, further comprising the step of iteratively adjusting the placement of said pipeline latches to guarantee high speed capability of a test clock operation.

3. The method of claim 1, wherein a flush control is added to said pipeline latches to override said pipeline latches and eliminate a synchronizing effect of a system clock and to pass the Shift A and Shift B test clock signals to said LSSD registers.

4. The method of claim 3, wherein said flush control is coupled to said pipeline latches that distribute said Shift A and Shift B test clocks throughout the LSSD system.

5. The method of claim 3, wherein said flush control is provided by a primary input.

6. The method of claim 3, wherein said flush control, when inactive, allows control of the Shift A and Shift B test clock propagation by the system clock.

7. The method of claim 3, whereas said flush control suppresses switching activity within said pipeline latches to save power during a normal system mode.

8. The method of claim 1, wherein grouping said LSSD registers is performed by a hierarchical partitioning of the LSSD system and is determined by the position of the LSSD register in said partition.

9. The method of claim 1, wherein said Shift A and Shift B test clocks are locally synchronized for high-speed operation to reduce a Built-in Self Test (BIST) test time of a BIST.

10. The method of claim 9, wherein said BIST is a logic BIST or an array BIST.

11. The method of claim 1 wherein the step of balancing the pipeline depth comprises the step of: placing pipeline latches in proximity of each region of said LSSD registers; and ensuring equal pipeline depth at the input of each of said LSSD registers.

12. The method of claim 1, wherein the step of ensuring that all said Shift A and Shift B test clocks are distributed at high speed further comprises analyzing a wire distribution, buffering, delay and loading of all the pipeline latches.

13. The method of claim 12, where all said Shift A and Shift B test clock signals are received at the next pipeline latch or at the input of an LSSD register within an allowable cycle time.

14. The method of claim 1, further comprising the step of iteratively adjusting the placement or configuration of the pipeline latches in order to enable a high speed operation of said Shift A and Shift B test clocks.

15. The method of claim 3, wherein gates internal to said pipeline latches are deactivated by said flush control when running the LSSD system in a normal mode, and signals generated by said Shift A and Shift B clocks are provided without interference from said pipeline latches.

16. The method of claim 15, wherein when said flush control is deactivated, said pipeline latches propagate data through master latches of said LSSD registers.

17. A program storage device readable by a machine, tangibly embodying a program of instructions executable by the machine to perform method steps for maximizing the frequency of test clocks in a Level Sensitive Scan Design (LSSD) system wherein non-overlapping Shift A and Shift B test clocks are synchronized to rise and fall simultaneously at inputs of all LSSD registers, the method comprising the steps of:
   determining the number of pipeline stages needed to reach the farthest corner of said LSSD system to establish the depth of the pipeline;
   grouping said LSSD registers into regions defined by the number of pipeline stages needed to ensure high speed operation;
   balancing the pipeline depth to achieve a simultaneous rise or fall of a signal at the inputs of said LSSD registers; and
   ensuring that all Shift A and Shift B test clocks are distributed at high speed, and verifying that pipeline latches are placed in proximity of the LSSD registers to enable high speed synchronous propagation of said Shift A and Shift B test clocks.

* * * * *